United States Patent
Miyamoto

(10) Patent No.: US 9,058,102 B2
(45) Date of Patent: Jun. 16, 2015

(54) SYMBOL INPUT DEVICE, IMAGE FORMING APPARATUS INCLUDING THE SYMBOL INPUT DEVICE, AND METHOD FOR INPUTTING SYMBOLS

(75) Inventor: Kazuhiko Miyamoto, Osaka (JP)

(73) Assignee: KYOCERA DOCUMENT SOLUTIONS INC., Osaka (JP)

(*) Notice: Subject to any disclaimer, the term of this patent is extended or adjusted under 35 U.S.C. 154(b) by 119 days.

(21) Appl. No.: 13/557,304

(22) Filed: Jul. 25, 2012

(65) Prior Publication Data

US 2013/0027313 A1  Jan. 31, 2013

(30) Foreign Application Priority Data

Jul. 26, 2011  (JP) ................. 2011-163253

(51) Int. Cl.
  *G06F 3/0488* (2013.01)
  *G06F 3/023* (2006.01)
  *H03M 11/10* (2006.01)
  *H03M 11/12* (2006.01)

(52) U.S. Cl.
  CPC ........... *G06F 3/04886* (2013.01); *H03M 11/12* (2013.01); *H03M 11/10* (2013.01); *G06F 3/0233* (2013.01)

(58) Field of Classification Search
  CPC ....... G06F 3/02; G06F 3/0233; G06F 3/0237; H03M 11/10; H03M 11/12
  USPC ............................... 341/21–24; 345/168, 169
  See application file for complete search history.

(56) References Cited

U.S. PATENT DOCUMENTS

| | | | |
|---|---|---|---|
| 6,744,424 B2* | 6/2004 | Maeda et al. | 345/173 |
| 8,441,377 B2* | 5/2013 | Liu | 341/24 |
| 2002/0070923 A1* | 6/2002 | Levy et al. | 345/169 |
| 2007/0188472 A1* | 8/2007 | Ghassabian | 345/169 |
| 2009/0273571 A1* | 11/2009 | Bowens | 345/173 |
| 2011/0095986 A1* | 4/2011 | Aono et al. | 345/168 |

FOREIGN PATENT DOCUMENTS

| | | | |
|---|---|---|---|
| JP | 4123220 A | * | 4/1992 |
| JP | H04-123220 A | | 4/1992 |
| JP | 2007-094836 | | 4/2007 |
| JP | 02007094836 A | * | 4/2007 |
| JP | 2008-009908 A | | 1/2008 |
| JP | 2008-104047 A | | 5/2008 |

* cited by examiner

Primary Examiner — Dwayne Bost
Assistant Examiner — Stefan M Oehrlein
(74) Attorney, Agent, or Firm — Morgan, Lewis & Bockius LLP

(57) ABSTRACT

A symbol input device includes a plurality of symbol keys, a correction key, a time keeping portion for measuring a time for which the symbol key is pressed and held, a storage portion for storing data, and an input receiving portion which accepts input with the symbol key or the correction key, recognizes a time for which the symbol key is pressed and held based on the measurement by the time keeping portion, automatically accepts re-input of the symbol corresponding to the symbol key when the time for which the same symbol key is pressed and held exceeds a predetermined long press time, and increases the long press time every time when the number of correction times that is the number of times of which the correction key has been pressed reaches a predetermined first number of times after the automatic re-input.

11 Claims, 9 Drawing Sheets

FIG.4

```
Address Book                                    F1
┌─────────────────────────────────────┐
│  No    Name        Detail           │
│ ☐ 9995 headquarters 06-6764-6666  ∧ │
│ ☑ 9996 Kyocera      06-6764-7777    │──B1
│ ☑ 9997 Kyocera2     aaaa@kyocera    │
│ ☐ 9998 Kyocera3     06-6764-5555    │
│ ☐                                 ∨ │  Detail
│ あ い さ た な は ま や ら わ 0-9   │~KG1
│ A-C D-F G-I J-L M-O P-S T-V W-Z     │
│ ✉E-mail 📁Folder 📠FAX 📠i-FAX ~KG2 Cancel OK │
```

FIG.5 registration/edit of address book (92)

- Destination name  abcdef  K1 — Change
- Second Destination name  K2 — Change
- Address number  0001  K3 — Change
- Fax number  K4 — Change
- SMB  K5 — Change
- FTP  K6 — Change
- Email address  abc@def.com  Change — K7

New | Cancel (K12) | Registration (K11)

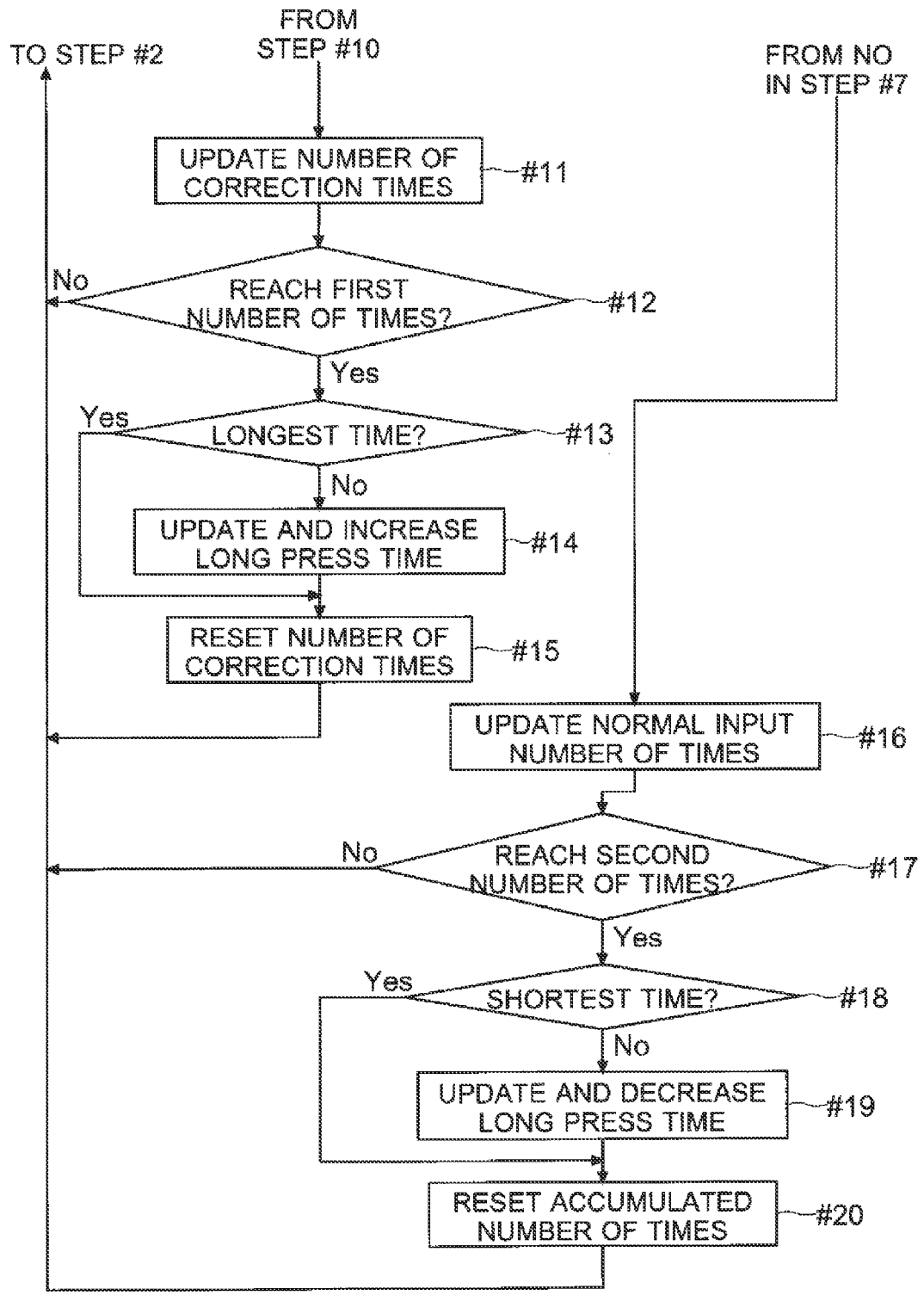

SYMBOL INPUT DEVICE, IMAGE FORMING APPARATUS INCLUDING THE SYMBOL INPUT DEVICE, AND METHOD FOR INPUTTING SYMBOLS

This application is based upon and claims the benefit of priority from the corresponding Japanese Patent Application No. 2011-163253 filed on Jul. 26, 2011, the entire contents of which are incorporated herein by reference.

FIELD

The present disclosure relates to a symbol input device for accepting input of symbols such as characters and numerals. In addition, the present disclosure relates to an image forming apparatus including the symbol input device.

BACKGROUND

When using an apparatus or a device, a user may input symbols including characters and numerals for various purposes such as address input or name input. For instance, an image forming apparatus such as a copier, a multifunction peripheral, a printer, a FAX apparatus is equipped with a symbol input device for accepting input of symbols (for example, an operation panel). In addition, for example, an electronics device such as a mobile phone is equipped with an input device including a plurality of keys for inputting characters and numerals.

In these apparatuses and devices, the number of keys to be mounted is limited. Therefore, there is a method in which when a key is pressed longer than normal, a display or an input acceptance is performed in a different manner from a case where the key is pressed once normally. Thus, even if the number of keys is limited, ways and methods of input can be increased. For instance, there is known the following technique for long press of key.

Specifically, there is the following electronics device. The device includes a key input device and a display device. In a period while a key is pressed long, display content is periodically (in a circulating manner) switched. The device further includes a specific operation detecting means that detects a specific operation for resetting the display content after the display content is periodically switched by the long press of key, and a control means that set a switching period of the display content by the long press of key to be longer (set a changing speed of displayed characters to be slower) based on a result of detection by the specific operation detecting means. With this structure, it is intended to automatically adjust switch timing of the display content of key input by the long press of key to an appropriate speed for the user.

When pressing a key, an elder person or a person with a handicapped hand or finger may press long unintentionally. For instance, when a symbol such as a character or a numeral is input, the character or the like corresponding to the long-pressed key may be input successively. In this case, it is necessary to perform correction of deleting the symbols accepted successively due to the unintentional long press. There is a problem that the correction of erroneous input due to the unintentional long press causes a mental or physical burden on the elder person or the person with a handicapped hand or finger.

Here, in the above-mentioned electronics device, the switching period of character display in a circulating manner is noted, so as to adjust the switching period to an individual. However, there is still a problem that the above-mentioned conventional electronics device is hard to handle for a person who cannot easily release the key at a timing corresponding to a position of a desired character among characters displayed in a circulating manner by the long press.

In addition, the above-mentioned conventional electronics device is not one in which a time until the long press is recognized (a time to continue to press until recognized to be the long press) is noted. Therefore, this method cannot be applied to an input device in which a character or the like corresponding to the long-pressed key is successively input. In other words, it is not possible to prevent undesired successive input of a symbol such as a character or a numeral due to an unintentional long press. Therefore, it is not possible to support a task of preventing the erroneous input of a symbol due to the unintentional long press.

SUMMARY

The present disclosure is made in view of the above-mentioned problem, and it is an object thereof to prevent an erroneous input due to the long press by changing a time until the long press is recognized in accordance with the user, so that a mental or physical burden due to correction of the input content is reduced.

In order to solve the above-mentioned problem, a symbol input device according to a first aspect of the present disclosure includes a plurality of symbol keys for inputting symbols including characters and numerals, a correction key for correcting input symbols, a time keeping portion for measuring a time for which the symbol key is pressed and held, a storage portion for storing data, and an input receiving portion which recognizes that the symbol key or the correction key is pressed so as to accept input with the symbol key or the correction key, recognizes the time for which the symbol key is pressed and held based on the measurement by the time keeping portion, recognizes that the symbol key is long pressed so as to automatically accept re-input of the symbol corresponding to the symbol key when the time for which the same symbol key is pressed and held exceeds a predetermined long press time, controls the storage portion to store the number of correction times that is the number of times of which the correction key has been pressed after automatic input that is the re-input performed automatically, and increases the long press time every time when the number of correction times reaches a predetermined first number of times.

Further features and advantages of the present invention will become apparent from the description of embodiments given below.

BRIEF DESCRIPTION OF THE DRAWINGS

FIG. 4 is an explanatory diagram illustrating an example of an address book screen.

FIG. 5 is an explanatory diagram illustrating an example of a transmission destination information registration screen.

FIG. 12 is a flowchart illustrating an example of a control flow for increasing or decreasing the long press time.

DETAILED DESCRIPTION

Now, embodiments of the present disclosure will be described with reference to FIGS. 1 to 12. Here, the present disclosure can be applied to various symbol input devices, and an operation panel 1 (corresponding to the symbol input device) of a multifunctional peripheral 100 (corresponding to the image forming apparatus) is described as an example. However, structures and arrangements of elements described in this embodiment are merely examples of description and should not be interpreted as limitations.

(Outline of Image Forming Apparatus)

Figure 1:
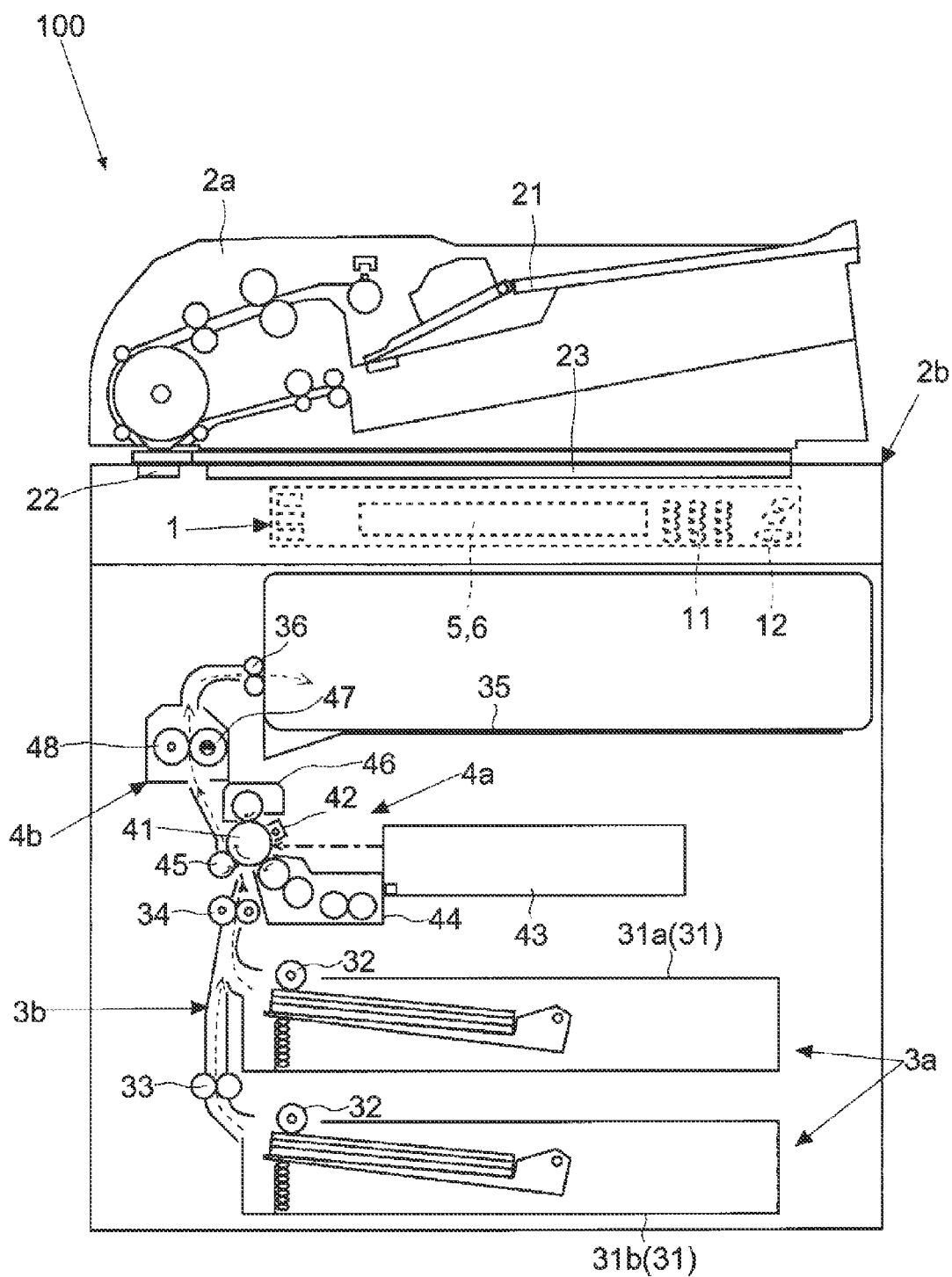
FIG. 1 is a schematic front cross sectional view illustrating an example of a multifunction peripheral.

First, with reference to FIG. 1, outline of the multifunctional peripheral 100 according to the embodiment is described. FIG. 1 is a schematic front cross sectional view illustrating an example of the multifunctional peripheral 100.

In an upper portion of the multifunctional peripheral 100 of this embodiment, there are disposed a document feeding device 2a, an image reading portion 2b, the operation panel 1, and the like. The document feeding device 2a successively feeds document sheets placed on a document placing tray 21 one by one to a reading position of the image reading portion 2b (a contact glass 22 for feed and read). In addition, the document feeding device 2a can be opened and closed by pivoting about an axis (not shown) disposed at the back side of the paper of FIG. 1 so that the front side swings. For instance, the document such as a book is placed on a contact glass 23 for place and read, and the document feeding device 2a is closed so that the document can be pressed down.

The image reading portion 2b reads the document so as to generate image data. Further, on the upper surface of the image reading portion 2b, the contact glasses (the contact glass 22 for feed and read and the contact glass 23 for place and read) are disposed. Inside the image reading portion 2b, there are disposed a moving frame (including an exposure lamp, a mirror, and the like) moving horizontally (in a left and right direction in FIG. 1), and optical system members (not shown) such as a lens and an image sensor (for example, a CCD). For instance, when document sheets fed successively by the document feeding device 2a are read, the moving frame is fixed under the contact glass 22 for feed and read so that reflection light from the document is guided to the lens and the image sensor. In addition, when a document placed on the contact glass 23 for place and read is read, the moving frame is moved in the horizontal direction so that reflection light from the document is guided to the lens and the image sensor.

Then, the image reading portion 2b uses these optical system members for illuminating the document, performs A/D conversion of an output value of each pixel of the image sensor receiving reflection light from the document, and generates image data. The multifunctional peripheral 100 can print based on the read image data (copy function).

In addition, as illustrated by broken a line in FIG. 1, the operation panel 1 is disposed on the front side of the image reading portion 2b (upper front of the multifunctional peripheral 100). Note that details of the operation panel 1 will be described later.

In addition, in a main body of the multifunctional peripheral 100, there are disposed a paper sheet feeder 3a, a transport portion 3b, an image forming portion 4a, a fixing portion 4b, and the like.

The paper sheet feeder 3a stocks and feeds paper sheets to be used for printing. The paper sheet feeder 3a includes two cassettes 31 (31a and 31b) that are detachable and stacked vertically. In each cassette 31, a plurality of paper sheets (for example, approximately 500 to 1000 sheets) of various types (for example, plain paper, copy paper, recycled paper, and the like) and various sizes (for example, A4, A3, B4, B5, letter size, and the like) are stacked and housed. Each cassette 31 (31a or 31b) is equipped with a paper feed roller 32. When printing is performed, one of the paper feed rollers 32 is driven to rotate so as to feed paper sheets.

The transport portion 3b is a path for transporting paper sheets. Further, a conveying roller pair 33, a registration roller pair 34, a delivery roller pair 36, and the like are disposed in the transport portion 3b. The conveying roller pair 33 is driven to rotate when the paper sheet is conveyed. The registration roller pair 34 holds the paper sheet to wait before the image forming portion 4a and sends out the same in synchronization with timing of forming a toner image. The delivery roller pair 36 delivers the paper sheet after fixing toward a delivery tray 35.

The image forming portion 4a forms an image (toner image) on the paper sheet fed from the paper sheet feeder 3a based on image data, and transfers the toner image onto the conveyed paper sheet. Note that image data of a document obtained by the image reading portion 2b or image data sent from a computer 200 connected to the multifunctional peripheral 100 (see FIG. 3) is used as the above-mentioned image data. Further, the image forming portion 4a includes a photosensitive drum 41 supported in a rotatable manner in axis direction illustrated in FIG. 1, and a charging device 42, an exposing device 43, a developing device 44, a transfer roller 45, a cleaning device 46, and the like, which are disposed around the photosensitive drum 41.

In substantially the middle of the image forming portion 4a, there is disposed the photosensitive drum 41 that is driven to rotate in a predetermined direction. The charging device 42 charges the photosensitive drum 41 at a predetermined potential. The exposing device 43 outputs a laser beam, which scans and exposes the surface of the photosensitive drum 41 based on the image data, so as to form an electrostatic latent image corresponding to the image data. The developing device 44 supplies toner to the electrostatic latent image formed on the photosensitive drum 41 so as to develop the same. The transfer roller 45 is pressed to the photosensitive drum 41 to form a nip. Then, the registration roller pair 34 sends the paper sheet to the nip in synchronization with timing. When the paper sheet with the toner image is in the nip, a predetermined voltage is applied to the transfer roller 45. Thus, the toner image on the photosensitive drum 41 is transferred onto the paper sheet. The cleaning device 46 cleans the toner and the like remaining on the photosensitive drum 41 after the transfer.

The fixing portion 4b fixes the toner image transferred onto the paper sheet. The fixing portion 4b in this embodiment includes a heating roller 47 in which a heating element is embedded and a pressing roller 48. The heating roller 47 and the pressing roller 48 press each other to form a nip. When the paper sheet passes through the nip, the toner is melted and heated so that the toner image is fixed onto the paper sheet.

The paper sheet after passing through the fixing portion 4b is sent to the delivery tray 35 and is delivered.

(Operation Panel 1)

Figure 2:
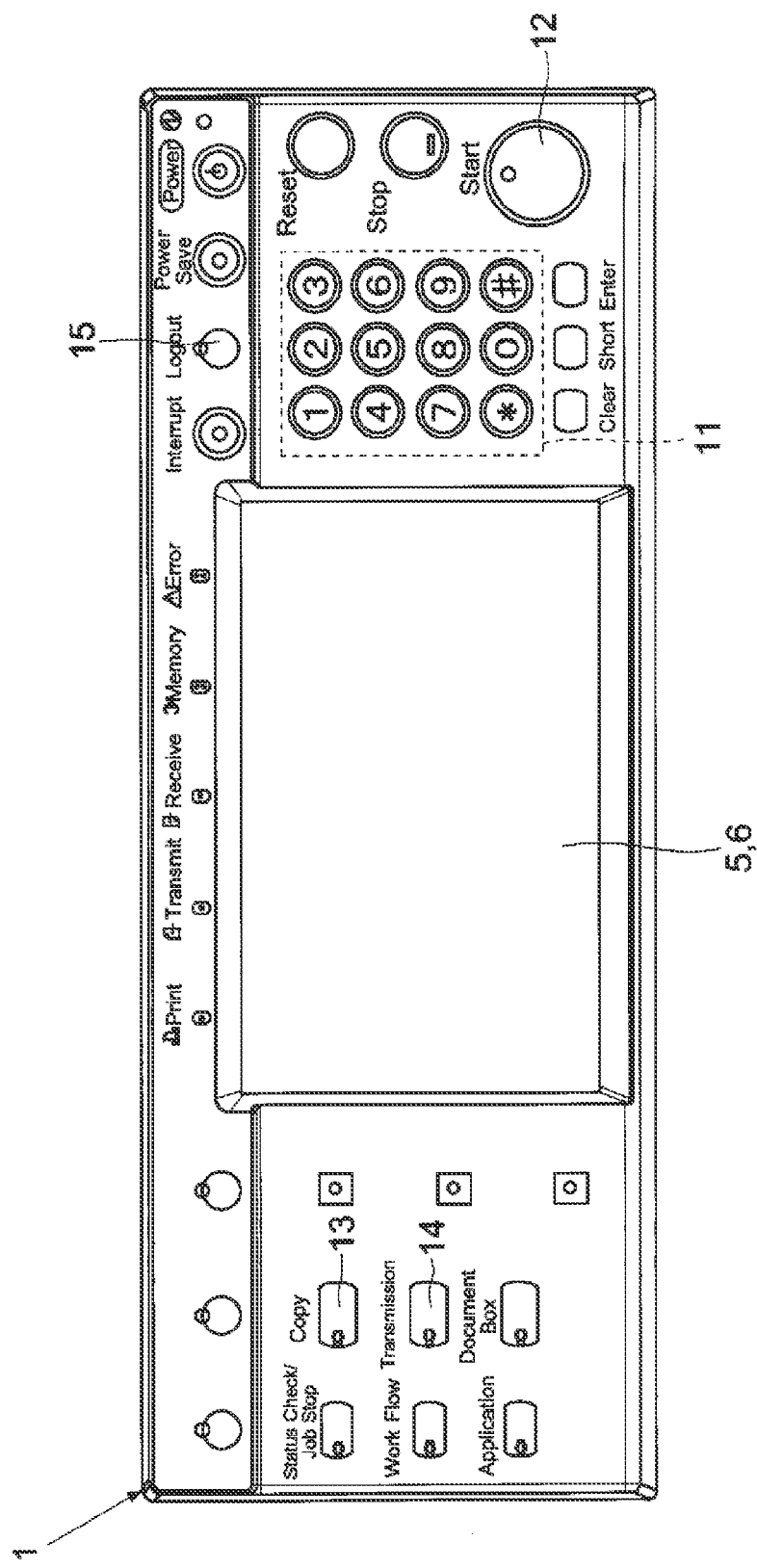
FIG. 2 is a plan view illustrating an example of an operation panel.

Next, with reference to FIG. 2, an example of the operation panel 1 according to the embodiment is described. FIG. 2 is a plan view illustrating an example of the operation panel 1.

The operation panel 1 functions as an input portion for setting for printing such as copying, reading a document, transmission of image data. Further, as illustrated in FIG. 1, the operation panel 1 is disposed on the upper front of the multifunctional peripheral 100. Further, the operation panel 1 includes a liquid crystal display portion 5 (corresponding to the display portion).

The liquid crystal display portion 5 displays one or more keys for selecting a function, setting, inputting characters, and the like. In addition, the liquid crystal display portion 5 can also indicates a status of the multifunctional peripheral 100. Then, the user can perform setting for printing, reading, or transmission of image data, or for printing based on image data stored in the multifunctional peripheral 100 by pressing a key on the setting screen displayed on the liquid crystal display portion 5.

In addition, a touch panel portion 6 (for example, a resistive film type touch panel) is disposed on the upper surface of the liquid crystal display portion 5. The touch panel portion 6 detects a position or coordinates of the pressed part on the liquid crystal display portion 5. The detected coordinates using the touch panel portion 6 is compared with positions or coordinates of various keys displayed on the liquid crystal display portion 5, so that the key pressed by the user is specified. Note that the touch panel portion 6 is not limited to a particular type, and a resistive film type, a surface acoustic wave type, an infrared type, a capacitance type, or other type can be adopted.

In addition, the operation panel 1 includes the following hardware keys (buttons). For instance, there are disposed a ten-key portion 11 for inputting numerals, a start key 12 for instructing to start a process such as copying after various setting, and the like. In addition, there are disposed a copy key 13 for using the copy function, a transmission key 14 for using the scanner function or the FAX function. In this way, the operation panel 1 also includes various hardware keys.

(Hardware Structure of Multifunctional Peripheral 100)

Figure 3:
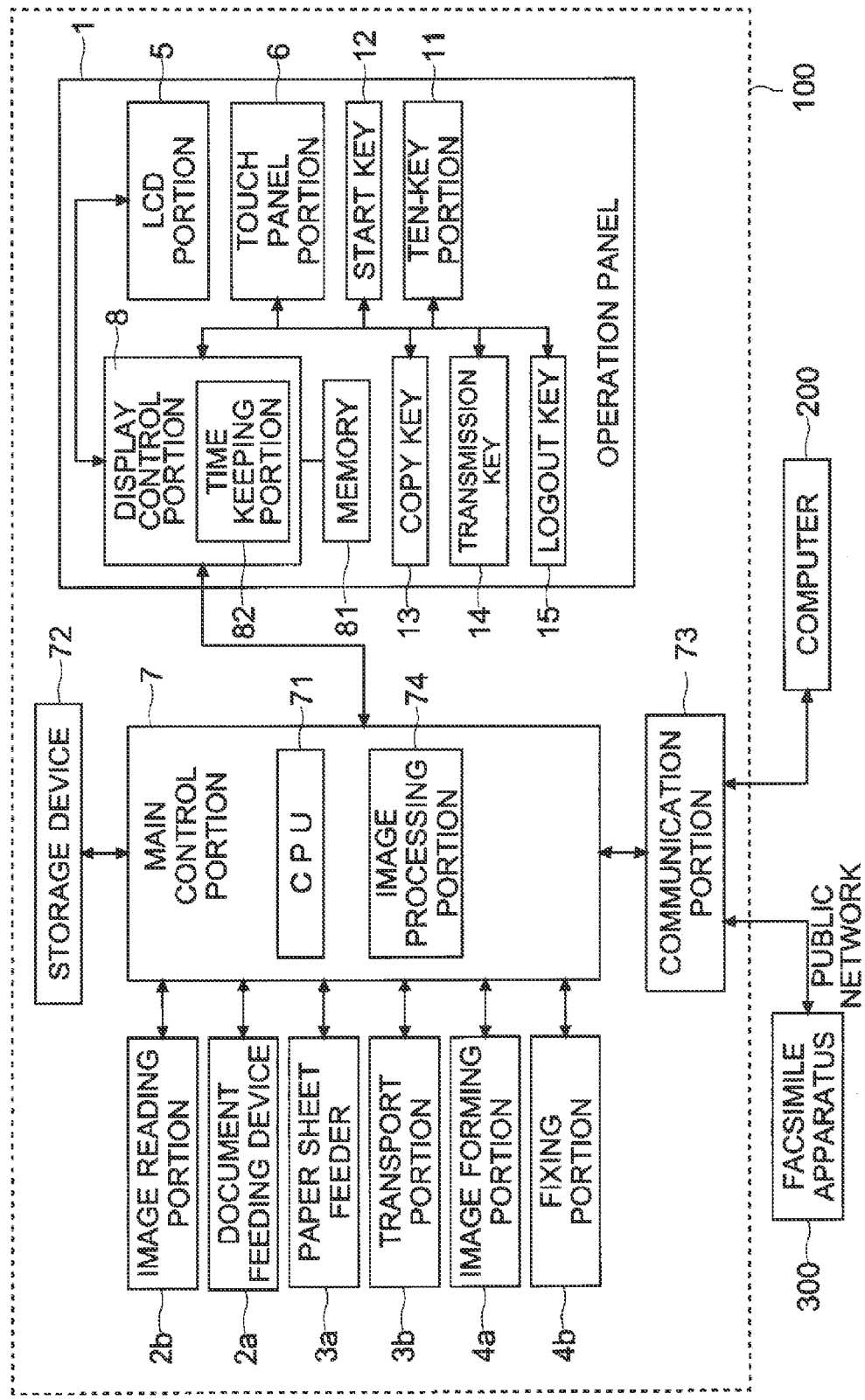
FIG. 3 is a block diagram illustrating an example of a hardware structure of the multifunction peripheral.

Next, with reference to FIG. 3, a hardware structure of the multifunctional peripheral 100 according to the embodiment is described. FIG. 3 is a block diagram illustrating an example of the hardware structure of the multifunctional peripheral 100.

In the multifunctional peripheral 100, there is disposed a main control portion 7. For instance, the main control portion 7 controls the operation panel 1, the document feeding device 2a, the image reading portion 2b, the paper sheet feeder 3a, the transport portion 3b, the image forming portion 4a, the fixing portion 4b, and the like.

For instance, the main control portion 7 includes a CPU 71 or the like for performing processes and calculations. The CPU 71 performs calculations or the like based on programs and controls individual portions of the multifunctional peripheral 100 based on control data stored in a storage device 72 (corresponding to the storage portion) to be extended. Note that the main control portion 7 may be split into a main control portion for performing general control and image processing, and an engine control portion for controlling image formation and printing by turning on and off motors for rotating various rotation members, in accordance with functions.

The storage device 72 is connected to the main control portion 7 so as to communicate with the same. The storage device 72 is constituted as a combination of a ROM, a RAM, an HDD, and the like. The storage device 72 can store control programs and various data such as control data, setting data, and image data for the multifunctional peripheral 100.

Then, the main control portion 7 is connected to a communication portion 73 (communication interface) including various connectors, sockets, a FAX modem, and the like so as to communication with the same. The communication portion 73 is connected to a plurality of computers 200 (for example, personal computers or servers), and FAX apparatuses 300 on the other party (only one for each of them is illustrated in FIG. 3 for convenience sake) via a network or a public network. For instance, image data obtained by reading the document with the image reading portion 2b can be transmitted to the computer 200 or the FAX apparatus 300 on the other party (the scanner function and the FAX function). In addition, the multifunctional peripheral 100 can perform printing, FAX transmission, and the like based on image data transmitted from the computer 200 or the FAX apparatus 300 on the other party and received (the printer function and the FAX function).

In addition, for example, the main control portion 7 includes an image processing portion 74 for performing image processing on the image data obtained by reading the document with the image reading portion 2b or the image data received by the multifunctional peripheral 100 via the communication portion 73. For instance, the image data processed by the image processing portion 74 is transmitted to the exposing device 43 and is used for scanning and exposing the photosensitive drum 41, or is stored in the storage device 72, or is transmitted to the computer 200 or the like.

In addition, the main control portion 7 is connected to the operation panel 1 so as to communicate with the same. The main control portion 7 receives from the operation panel 1a content of the input or the setting performed with the operation panel 1 and controls the multifunctional peripheral 100 so that copying or the like is performed in accordance with the setting performed by the user.

The operation panel 1 of this embodiment includes a display control portion 8 (corresponding to the input receiving portion), a memory 81 (corresponding to the storage portion), the liquid crystal display portion 5, the touch panel portion 6, and the like. The display control portion 8 is constituted of a CPU, an IC, a driver circuit for a liquid crystal panel of the liquid crystal display portion 5, and the like.

First, the display control portion 8 controls display of the liquid crystal display portion 5. In addition, the display control portion 8 receives an output of the touch panel portion 6 and specifies coordinates of a position pressed on the liquid crystal display portion 5 (touch panel portion 6). Data of a table or the like indicating correspondence between the output of the touch panel portion 6 and the coordinates is stored in the memory 81. The display control portion 8 compares the coordinates of the pressed position with image data of the screen displayed on the liquid crystal display portion 5 so as to specify and recognize the key selected (pressed) on the screen.

In addition, the display control portion 8 includes a time keeping portion 82 for keeping (measuring) time. For instance, the time keeping portion 82 measures time while a symbol key K8 displayed on the liquid crystal display portion 5 is pressed and held based on the output of the touch panel portion 6. Note that the time for which the symbol key K8 is pressed and held may be measured by using a time keeping function of the CPU in the display control portion 8.

In the normal operation, in order to select a setting item of each function of the multifunctional peripheral 100 so as to set a set value, selection of a key displayed on the liquid crystal display portion 5 is repeated from a display of the uppermost layer on the liquid crystal display portion 5. Then, the display control portion 8 controls the liquid crystal display portion 5 to switch the display every time when a key is selected, and finally sets a set value of the function to be selected and to be set. The display control portion 8 recognizes selection of a function (setting item) and setting input of a set value so as to transmit the set content to the main control portion 7 of the main body. Thus, the main control portion 7 controls the individual portions such as the image forming portion 4a to perform operation on which the function selected or set by the operation panel 1 is reflected (for example, density setting or scaling).

Then, the memory 81 in the operation panel 1 stores various image data of screens or images to be displayed on the liquid crystal display portion 5. Therefore, the display control portion 8 reads from the memory 81 the image data of a screen or an image to be displayed on the display control portion 8 every time when a key is pressed on each screen. Then, the display control portion 8 controls the liquid crystal display portion 5 to switch display.

(Input of Symbol by Operation Panel 1)

Figure 6:
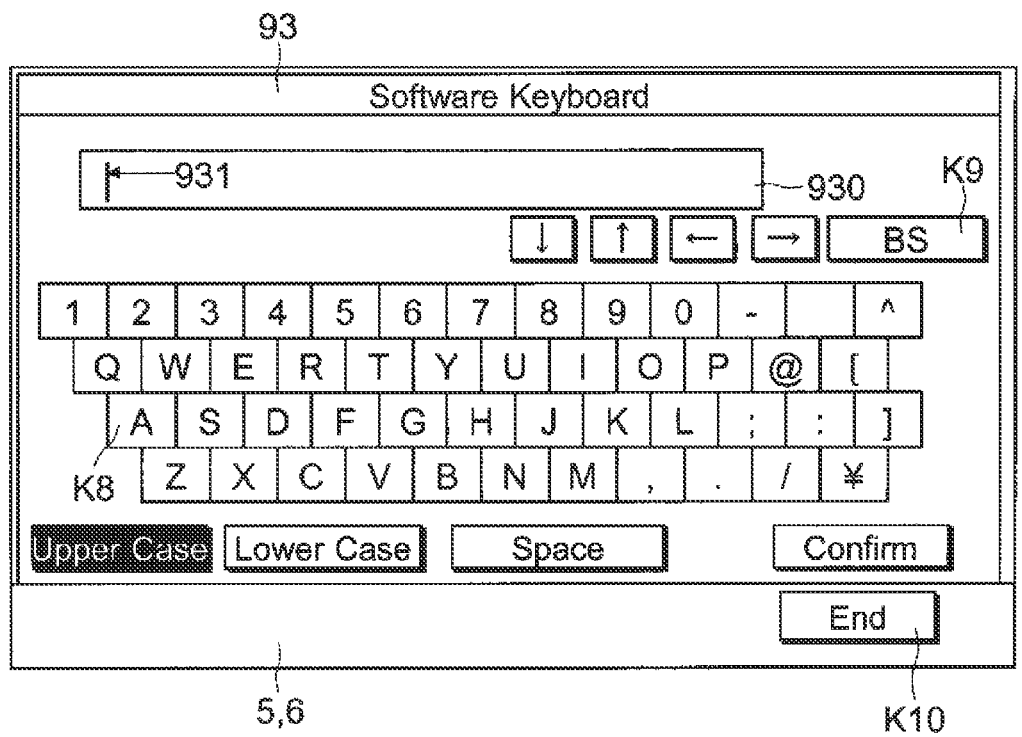
FIG. 6 is an explanatory diagram illustrating an example of a software keyboard screen.
Figure 7:
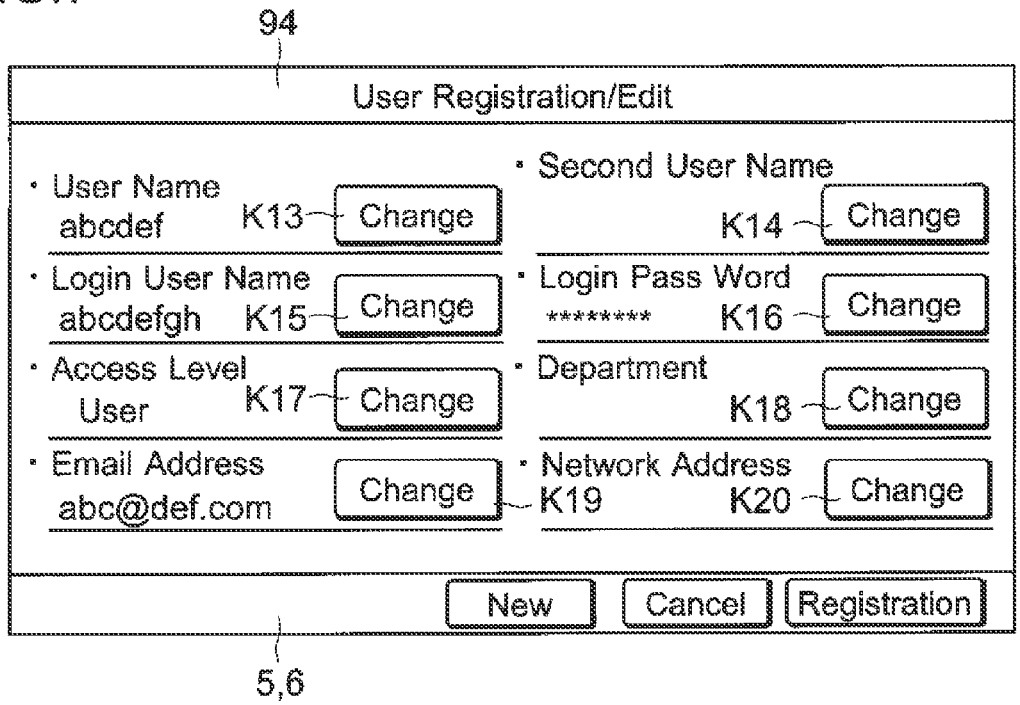
FIG. 7 is an explanatory diagram illustrating an example of a user registration screen.

Next, with reference to FIGS. 4 to 7, an example of a symbol input with the operation panel 1 according to the embodiment is described. FIG. 4 is an explanatory diagram illustrating an example of an address book screen 91. FIG. 5 is an explanatory diagram illustrating an example of a transmission destination information registration screen 92. FIG. 6 is an explanatory diagram illustrating an example of a software keyboard screen 93. FIG. 7 is an explanatory diagram illustrating an example of a user registration screen 94.

The multifunctional peripheral 100 of this embodiment can perform transmission or the like of image data of the document read by the image reading portion 2b. In this case, it is necessary to specify a transmission destination of the image data. Then, the memory 81 of the multifunctional peripheral 100 of this embodiment stores transmission destination information (such as a name of the destination or an address on the other party) so that it is not necessary to input the address or the like every time of transmission. For instance, the memory 81 can store information of a few thousand of transmitters. Then, the display control portion 8 reads transmission destination information stored in the memory 81 and controls the liquid crystal display portion 5 to display an address book including transmission destination information.

Note that the transmission destination information (a name of the destination or an address of the other party) may be stored in the storage device 72 on the main body side. In this case, the display control portion 8 obtains transmission destination information from the storage device 72 and controls the liquid crystal display portion 5 to display the address book.

Specifically, FIG. 4 illustrates an example of the address book screen 91. For instance, when the transmission key 14 is pressed, the display control portion 8 controls the liquid crystal display portion 5 to display the address book screen 91 as illustrated in FIG. 4. The liquid crystal display portion 5 displays a list of transmission destination information store in the storage device 72 or the memory 81, in the address book screen 91.

The display control portion 8 controls to display the transmission destination information in a list display area F1 of the address book screen 91. Then, there is a case where all the transmission destination information cannot be displayed in the list display area F1. Therefore, a scroll bar B1 is disposed on the right side of the list display area F1. When the scroll bar B1 is pressed, the display control portion 8 controls the liquid crystal display portion 5 to switch the transmission destination information displayed in the list display area F1.

Then, in the lower part of the list display area F1, there are disposed a first narrowing-down key group KG1 for narrowing down transmission destination information by the name of the destination, and a second narrowing-down key group KG2 for narrowing down the same by a registered transmission method. The first narrowing-down key group KG1 includes keys for narrowing down an initial character of the name of the destination by unit of a plurality of alphabetical characters. In addition, the second narrowing-down key group KG2 includes keys for narrowing down by the transmission method such as email or facsimile. The display control portion 8 narrows down the transmission destination information under the condition corresponding to the pressed narrowing-down key, and controls the liquid crystal display portion 5 to display the transmission destination information after the narrowing-down.

In order to display the list of the transmission destination information in the address book screen 91 as described above, it is necessary to register the transmission destination information in advance in the memory 81 (or in the storage device 72). Further, FIG. 5 illustrates an example of the transmission destination information registration screen 92 as a screen for registration and input of the transmission destination information.

When a predetermined input is performed with the operation panel 1, the display control portion 8 controls the liquid crystal display portion 5 to display the transmission destination information registration screen 92. As items that can be registered as the transmission destination information, there are items such as a destination name, an address number (serial number), a FAX number, an SMB, an FTP, and an email address. When one of CHANGE keys K1 to K7 disposed on the right sides of individual items is pressed, the display control portion 8 controls the liquid crystal display portion 5 to display the software keyboard screen 93 as illustrated in FIG. 6.

In the software keyboard screen 93, a plurality of keys for inputting various symbols including numerals and characters (alphabets in the example illustrated in FIG. 6) (hereinafter referred to as the symbol key K8) are displayed (only the symbol key corresponding to the "A" character is denoted by K8 in FIG. 6). In addition, as the symbol key K8, there are also keys for inputting parentheses, a colon, and the like.

The display control portion 8 recognizes the pressed symbol key K8 based on the output of the touch panel portion 6, and accepts an input of the symbol such as a character, a numeral, or the like corresponding to the recognized symbol key K8. The software keyboard screen 93 includes an input result display field 930 indicating a result of input. The display control portion 8 control to display the symbol such as a character or a numeral for which the input has been accepted in the input result display field 930. In other words, the liquid crystal display portion 5 displays the symbol such as an alphabet or a numeral corresponding to the key pressed by the user in the input result display field 930 every time when the symbol key K8 is pressed.

In addition, in the software keyboard screen 93, there is displayed a correction key K9 for correcting the input (accepted) symbol. In the software keyboard screen 93 illustrated in FIG. 6, a BS key (backspace key) corresponds to the correction key K9. When the BS key is pressed, the display control portion 8 deletes a character just before a cursor 931 displayed in the input result display field 930 (a vertical stem in the example of FIG. 6). Note that a position of the cursor 931 can be moved by an arrow key.

In order to finish the input of symbols such as characters and numerals on the software keyboard screen 93, the user presses an END key K10. When the END key K10 is pressed, the display control portion 8 controls the liquid crystal display portion 5 to display the transmission destination information registration screen 92 and controls the liquid crystal display portion 5 to display a result of input below the item for which the input is performed.

Further, when a REGISTRATION key K11 is pressed in the transmission destination information registration screen 92, the display control portion 8 controls to store the input content in the memory 81 or in the storage device 72. Note that when a NEW key K12 is pressed on the transmission destination information registration screen 92, the display control portion 8 controls to display a new transmission destination information registration screen 92 that is not input for each item. Thus, the user can register new transmission destination information.

In addition, as illustrated in FIG. 7, in the multifunctional peripheral 100 of this embodiment, it is possible to register a person who uses the multifunctional peripheral 100. For instance, as items that can be registered as the user information, there are items such as a user name, a login user name (login ID), a login password, an access level, a belonging department, an email address, and a network address.

When one of CHANGE keys K13 to K20 disposed on the right side of the individual items is pressed, the display control portion 8 controls the liquid crystal display portion 5 to display the software keyboard screen 93 as illustrated in FIG. 6 similarly to the case where the transmission destination information is registered. Then, using the touch panel portion 6 and the like, the display control portion 8 accepts input in the software keyboard screen 93 or input for each item.

The user information is stored in the memory 81 (or in the storage device 72) similarly to the transmission destination information. Then, the display control portion 8 specifies the user by using the user information. Therefore, specifying of the user (user authentication) is described next.

(Specifying of User)

Figure 8:
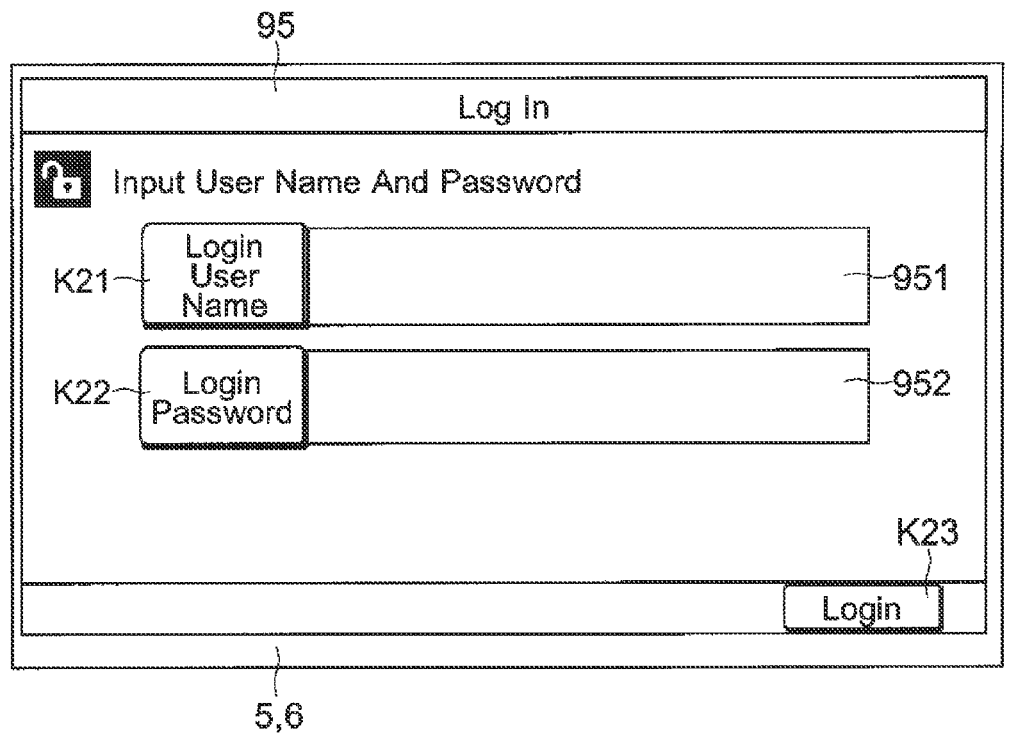
FIG. 8 is an explanatory diagram illustrating an example of a login screen.

Next, with reference to FIG. 8, an example of specifying (authentication) of the user in the multifunctional peripheral 100 according to the embodiment is described. FIG. 8 is an explanatory diagram illustrating an example of a login screen 95 in the operation panel 1.

First, it is supposed that the main control portion 7 is basically in a state of disabling to use the multifunctional peripheral 100 (logout state). In addition, the operation panel 1 does not accept the job start instruction or the like in the logout state. For instance, in the logout state, even if the start key 12 is pressed, the operation panel 1 neglects it, the main control portion 7 neglects the action instruction input, and document reading or printing is not performed. In addition, even if the external computer 200 sends the image data, the main control portion 7 stores the received image data temporarily in the storage device 72 or the like, but does not perform printing.

On the other hand, when the user is specified and authenticated as a person who can use the apparatus, the operation panel 1 becomes a login state. Then, in the login state, the operation panel 1 accepts various setting by the user. In addition, a job execution is instructed with the operation panel 1, the main control portion 7 controls individual portions to perform the job. In addition, the operation panel 1 accepts selection of a function in the job (copy, scan, transmission, or the like), setting of a set value, and an instruction to start execution of the job.

When using the multifunctional peripheral 100, the user performs input for the authentication with the operation panel 1 so as to log in. As illustrated in FIG. 8, in order to log in, the user inputs information for identifying the user (identification information) such as a user name (or user ID) and a login password on the login screen 95. The login screen 95 is displayed on the liquid crystal display portion 5 in the logout state of the multifunctional peripheral 100.

For instance, when a login user name key K21 or a login password key K22 is pressed, the display control portion 8 controls the liquid crystal display portion 5 to display the software keyboard screen 93 illustrated in FIG. 6. Then, the user inputs a login user name and a login password that are registered in advance. Then, the display control portion 8 controls to display a result of input in a login user name display field 951 and in a login password display field 952. Note that for example, characters displayed in the login password display field 952 are a plurality of "*" or the like corresponding to the number of password characters, but the password itself is not displayed.

When the input of the login user name and the login password (input of the identification information) is finished, the user presses a login key K23. When the login key K23 is pressed, the display control portion 8 performs an authentication process so as to specify the user. For instance, the display control portion 8 obtains the user information from the memory 81 or the storage device 72 and compares the same with the input identification information, so as to check whether or not the user information is partially the same as the identification information (whether or not there is the same user). Thus, the display control portion 8 performs specifying (authentication) of the user who intends to use the multifunctional peripheral 100.

When the specifying of the user is performed, the display control portion 8 transmits to the main control portion 7 the data indicating that the user can use the multifunctional peripheral 100 and data about the user. In addition, the display control portion 8 release a lock of the operation panel 1 to be in the login state. Then, the display control portion 8 accepts setting of various functions and a job start instruction if any.

After the multifunctional peripheral 100 is used, if the apparatus is left in the login state, anyone can use the multifunctional peripheral 100. Therefore, there is a problem of information security if the login state of the multifunctional peripheral 100 is left. Therefore, the multifunctional peripheral 100 and the operation panel 1 become in the logout state after being used.

The user can issue an instruction to change from the login state to the logout state by pressing a logout key 15 on the operation panel 1 (see FIG. 2). Otherwise, for example, the display control portion 8 checks whether or not a predetermined change time (for example, one minute, which can be set by the operation panel 1) has passed without any input to the operation panel 1 after the job finished. After the state without any input to the operation panel 1 continues for a predetermined change time, the display controls portion 8 controls to display the login screen 95 and controls the operation panel 1 to be in the logout state. In addition, the display control portion 8 transmits data indicating being in the logout state to the main control portion 7. Thus, the operation panel 1 and the multifunctional peripheral 100 become in the logout state.

(Long Press of Symbol Key K8)

Figure 9:
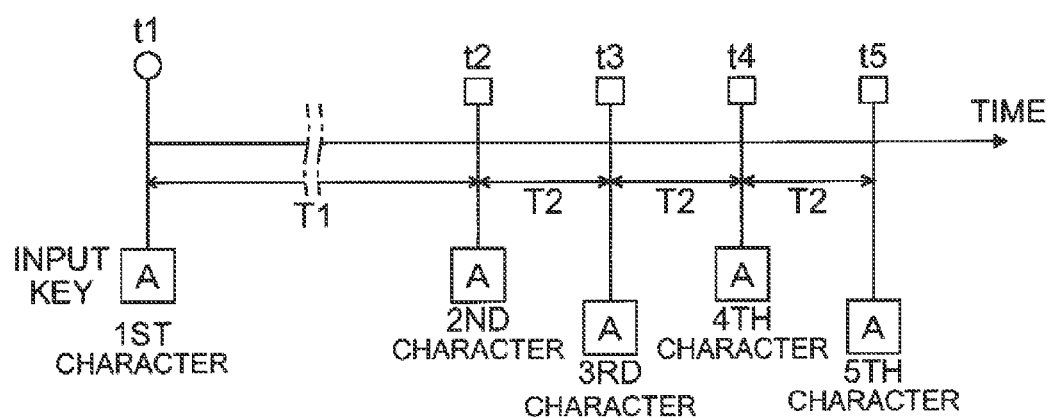
FIG. 9 is an explanatory diagram illustrating an outline of input by the long press on the operation panel.

Next, an outline of input by long press of the symbol key K8 in the operation panel 1 of this embodiment is described. FIG. 9 is an explanatory diagram illustrating an outline of input by long press in the operation panel 1.

Figure 10A:
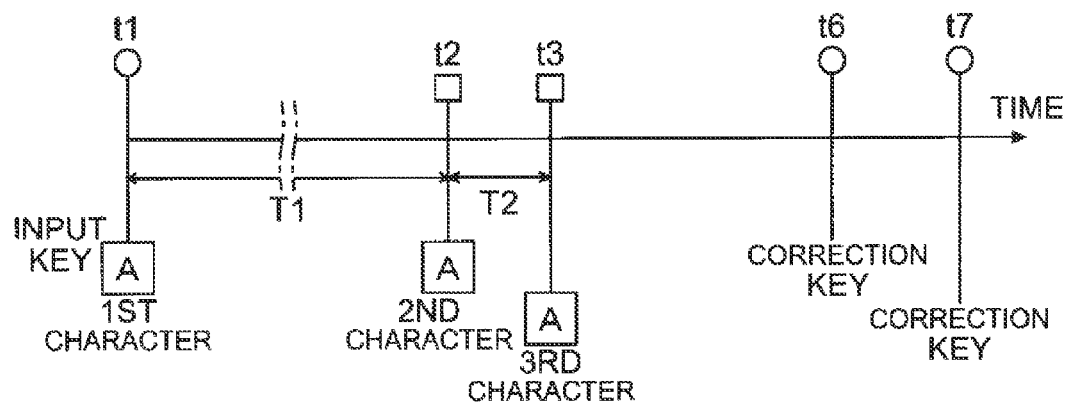
FIG. 10A is an explanatory diagram illustrating an increase of long press time.
Figure 10B:
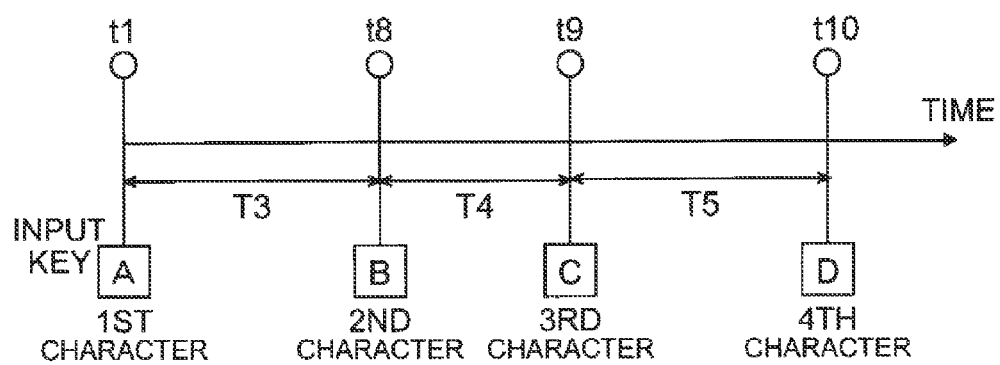
FIG. 10B is an explanatory diagram illustrating a decrease of the long press time.

First, a horizontal axis in FIG. 9 represents a time axis, in which time increases from the left side to the right side (the same is true in FIGS. 10A and 10B). Further, in this description, there is described a case of accepting the symbol input when the symbol key K8 of the alphabet "A" is long pressed in the software keyboard screen 93 (the same process is performed in cases of other symbol keys K8).

First, FIG. 9 illustrates that the symbol key K8 of "A" is pressed at time point of t1. The display control portion 8 recognizes that the symbol key K8 of "A" is pressed and accepts the input of the character "A". As a result, the display control portion 8 controls to display the character "A" at the position of the cursor 931 in the input result display field 930 of the software keyboard screen 93.

Based on an output from the touch panel portion 6 and time keeping by the time keeping portion 82, the display control portion 8 can recognize that the symbol key K8 is pressed and held. In other words, the display control portion 8 recognizes a period of time for which the symbol key K8 is pressed and held. In this way, the display control portion 8 recognizes that the symbol key K8 and the correction key K9 are pressed so as to accept inputs of the symbol key K8 and the correction key K9, and recognizes the period of time for which the symbol key K8 is pressed and held based on time keeping by the time keeping portion 82. Then, the display control portion 8 checks whether or not the symbol key K8 is pressed and held for a predetermined long press time T1. In this description, the display control portion 8 checks whether or not the symbol key K8 of "A" is pressed and held.

In the operation panel 1 of this embodiment, the long press time T1 varies, and a standard value of the long press time T1 is 750 milliseconds, for example. Note that the long press time T1 is time that can be decided arbitrarily.

When the symbol key K8 is pressed and held for the long press time T1, the display control portion 8 recognizes that the symbol key K8 has been long pressed. When the symbol key K8 is long pressed, the display control portion 8 decides that the symbol such as a character or a numeral corresponding to the long pressed symbol key K8 is input and automatically accepts input of the symbol corresponding to the long pressed symbol key K8. In other words, when a period of time for which the same symbol key K8 is pressed and held exceeds the predetermined long press time T1, the display control portion 8 recognizes that the symbol key K8 is long pressed and automatically accepts re-input of the symbol corresponding to the symbol key K8. In the example illustrated in FIG. 9, when the symbol key K8 of "A" is pressed and held, and the long press time T1 passes after the symbol key K8 of "A" was pressed at time point t1 so as to be time point t2, the display control portion 8 decides that the character "A" is input (the symbol key K8 of "A" is pressed) and performs automatic input of the character "A" so that the second "A" character is displayed in the input result display field 930.

When the symbol key K8 is still being pressed (long pressed) after the long press time T1 has passed after the symbol key K8 was pressed, the input receiving portion (display control portion 8) decides that the symbol such as a character or a numeral corresponding to the same symbol key K8 (the long pressed symbol key K8) is input at a constant period T2, and automatically accepts the input of the symbol corresponding to the long pressed symbol key K8 at the constant period T2. Thus, by continuously pressing the symbol key K8, the same character can be automatically and successively input.

In the example illustrated in FIG. 9, when the symbol key K8 of "A" is pressed and held after the time point t2 has passed, the display control portion 8 decides that the character "A" is input (the symbol key K8 of "A" is pressed) at the constant period T2, performs automatic input of the character "A", and controls to display the character "A" of the third and following characters in the input result display field 930. For instance, the example illustrated in FIG. 9 shows a case where after the second character of "A", the third to fifth characters of "A" are input at the constant period T2 by long press. Note that the constant period T2 can be arbitrarily set, but it is set to be shorter than the long press time T1 so that consecutive character input is automatically accepted by the long press (for example, to be approximately 1/20 to a fraction of the long press time T1). For instance, the constant period T2 can be approximately 40 milliseconds.

(Outline of Increasing or Decreasing Long Press Time T1)

Next, using FIG. 10, increasing or decreasing of the long press time T1 with the operation panel 1 of this embodiment is described. FIG. 10A is an explanatory diagram illustrating increase of the long press time T1. FIG. 10B is an explanatory diagram illustrating decrease of the long press time T1.

The memory 81 (or the storage device 72) of the operation panel 1 of this embodiment stores the long press time T1 for each user. Specifically, the user is specified by login. Then, the display control portion 8 reads the predetermined long press time T1 for the specified user from the memory 81 or the storage device 72. The display control portion 8 decides whether or not the symbol key K8 is long pressed based on the long press time T1 for each user. In addition, in the operation panel 1 of this embodiment, the appropriate long press time T1 is set for each user, and hence the long press time T1 is changed (increased or decreased) for each user in accordance with a state of use.

As described above, in this embodiment, by long pressing, the same character, numeral, or the like corresponding to the long pressed symbol key K8 can be successively input. However, when an elder person or a person with a handicapped hand or finger presses a key, the key may be unintentionally pressed long.

When the unintentional long press is performed, it is necessary to correct the symbol such as a character or a numeral for which input is accepted in the operation panel 1 of this embodiment. For instance, when the user intends to input "ABC" by the symbol keys K8 in the software keyboard screen 93, if the symbol key K8 of the character "A" is unintentionally long pressed, the character "A" is consecutively input like "AAA . . . ". Then, it is necessary to perform correction of deleting the character "A" for which input is accepted in an overlapped manner (automatically input) by using the correction key K9.

This correction work causes a mental or physical burden on the elder person or the person with a handicapped hand or finger. Therefore, in the operation panel 1 of this embodiment, the period of time until the long press of the symbol key K8 is detected (long press time T1) is increased and changed, so as to reduce the burden on the elder person or the person with a handicapped hand or finger.

The display control portion 8 of this embodiment checks whether or not the correction key K9 is pressed when the same symbol such as a character or a numeral is input by long press. Thus, it is checked that erroneous input is accepted by the unintentional long press and the automatic input.

Specific description is given below with reference to FIG. 10A. FIG. 10A illustrates an example where "AAA" is input by long press of the symbol key K8 of the character "A". Further, FIG. 10A illustrates that the correction key K9 is pressed two times after input of three consecutive characters "A" by the long press are accepted. In this case, it can be said that the current long press time T1 is too short for the elder person or the person with a handicapped hand or finger.

Therefore, the display control portion 8 controls to store the number of correction times that is the accumulated number of times of which the correction key K9 has been pressed after automatic input of the symbol by long press (automatic accept of input). When this number of correction times reaches a predetermined number of times (first number of times), the long press time T1 is increased so that the long press is hardly recognized even if the same symbol key K8 is pressed and held.

Here, the first number of times can be set to five times, for example. In other words, when the correction key K9 is pressed five times so as to correct the character input automatically by long press, the long press time T1 is increased. In addition, the first number of times may be set to a value less than five (for example, one to three) or a value larger than six, which can be arbitrarily determined.

On the contrary, while using the operation panel 1, the user may be accustomed to the operation of the software keyboard screen 93. For instance, the user may be accustomed to the automatic input by long press. Then, a user who thinks that the time until the long press is recognized is long may appear.

For instance, when the user intends to input "AAA" using the automatic input by long press of the symbol key K8 in the software keyboard screen 93, if the time until the display control portion 8 recognizes that the symbol key K8 of the character "A" is long pressed is long, the user may get frustrated. Therefore, it is preferred to decrease the long press time T1 for a user who is accustomed to the input operation.

When the user can smoothly perform input of the symbol key K8, there is little possibility to perform an unintentional long press. Therefore, the display control portion 8 of this embodiment checks a normal input number of times that is the accumulated number of times of which different symbols such as characters or numerals are input without exceeding the long press time T1 (without being the long press). If the normal input number of times exceeds a predetermined number of times (second number of times), it is regarded that there is little possibility of performing an unintentional long press, and hence the long press time T1 is decreased.

For instance, the second number of times can be set to five. In other words, when the symbol key K8 is pressed five times normally without long press, the long press time T1 is decreased. Note that the second number of times may be set smaller than five (for example, one to three), which can be arbitrarily determined. Note that the second number of times may be set to a few tens of times in order that the long press time T1 is decreased at the same frequency as the increase of the long press time T1.

With reference to FIG. 10B, specific description is made below. FIG. 10B illustrates an example where the symbol keys K8 of characters "A", "B", "C", and "D" are pressed without long press so that "ABCD" is input.

Then, in FIG. 10B, time from pressing of the symbol key K8 of "A" until pressing of the symbol key K8 of "B" is indicated as time T3. In addition, time from pressing of the symbol key K8 of "B" until pressing of the symbol key K8 of "C" is indicated as time T4. In addition, time from pressing of the symbol key K8 of "C" until pressing of the symbol key K8 of "D" is indicated as time T5.

Note that the user may press and hold the symbol key K8 for a certain period of time and simultaneously press the next symbol key K8. Further, the time T3 to the time T5 illustrated in FIG. 10B are shorter than the long press time T1. For instance, even if the symbol key K8 of "A" is pressed and held for the time T3, or even if the symbol key K8 of "B" is pressed and held for the time T4, or even if the symbol key K8 of "C" is pressed and held for the time T5, because they are shorter than the long press time T1, the display control portion 8 does not recognize that the symbol key K8 of any one of characters is long pressed.

(Flow of Increasing Control of Long Press Time T1)

Figure 11:
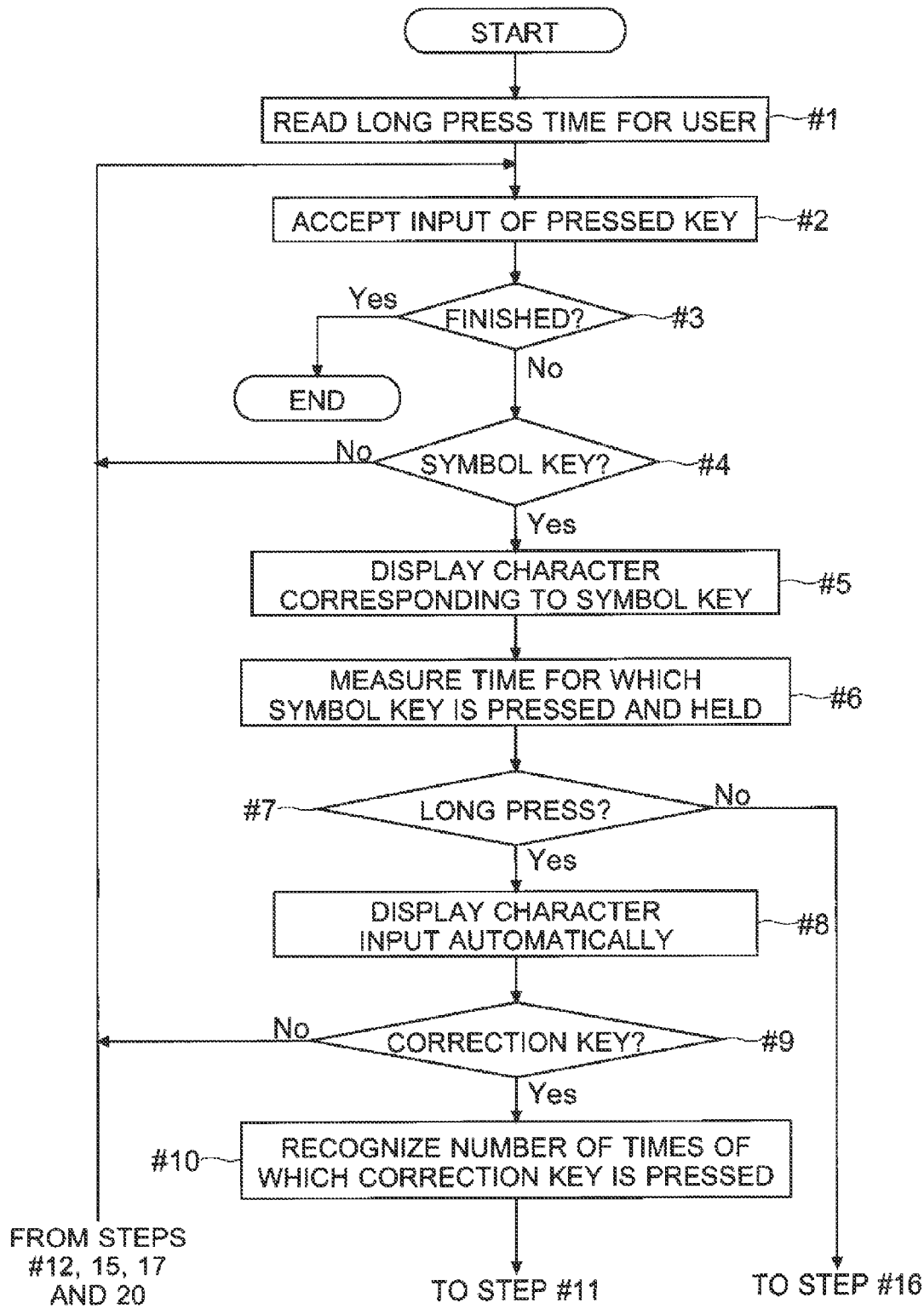
FIG. 11 is a flowchart illustrating an example of a control flow for increasing or decreasing the long press time.

Next, with reference to FIGS. 11 and 12, an example of a control flow of increasing the long press time T1 with the operation panel 1 of this embodiment is described. FIGS. 11 and 12 are flowcharts illustrating an example of a control flow of increasing or decreasing the long press time T1. Note that a sequential flow of control of increasing the long press time T1 is split into FIGS. 11 and 12, which are referred to in the description.

First, the flow of FIG. 11 starts at a time point when login is made so as to become the state for inputting symbol such as a character or a numeral. For instance, it is the time point when the software keyboard screen 93 is displayed in the address book screen 91 or the transmission destination information registration screen 92.

First, the display control portion 8 reads the long press time T1 for the logged-in user from the memory 81 (Step #1). The memory 81 (or the storage device 72) stores the long press time T1 for each user in advance. Then, in accordance with the state of pressing the key, the long press time T1 is changed for each user (details will be described later). In this way, the input receiving portion (display control portion 8) specifies the user based on the input with the symbol key K8, obtains the long press time T1 for the specified user from the storage portion, and accepts the input by the obtained long press time T1. Thus, the long press time T1 that is appropriate for each user can be set. Therefore, each user can comfortably operate long press for input. Specifically, the symbol input device (operation panel 1) includes the display portion (liquid crystal display portion 5) for displaying the plurality of symbol keys K8 and the correction key K9 (BS key), and the touch panel portion 6 for detecting the pressed position on the display portion. The input receiving portion recognizes the pressed symbol key K8 or correction key K9 based on the output of the touch panel portion 6 so as to accepts the input, and recognizes a period of time for which the symbol key K8 is pressed and held. Thus, it is possible that erroneous input of a symbol due to an unintentional long press hardly occurs as for input of the symbol key K8 displayed on the display portion too.

Then, the display control portion 8 accepts key input when the user presses any one of keys (Step #2). Then, the display control portion 8 checks whether or not to finish the input on the software keyboard screen 93 (Step #3). In other words, the display control portion 8 checks whether or not the END key K10 is pressed on the software keyboard screen 93.

If the END key K10 is pressed (Yes in Step #3), this flow is finished (END). On the other hand, if the pressed key is not the END key K10 (No in Step #3), the display control portion 8 checks whether or not the pressed key is the symbol key K8 for inputting a character (for example, alphabet) or a numeral (Step #4). For instance, when a key for specifying an upper case character or a lower case character is pressed, the display control portion 8 recognizes that the symbol key K8 is not pressed.

If the pressed key is not the symbol key K8 (No in Step #4), the display control portion 8 appropriately switches the display on the liquid crystal display portion 5, and the flow goes back to Step #2. On the other hand, if the pressed key is the symbol key K8 (Yes in Step #4), the display control portion 8 receives input of the symbol key K8 and controls the liquid crystal display portion 5 to display the character, numeral, or symbol corresponding to the symbol key K8 input in the input result display field 930 (Step #5). Then, the time keeping portion 82 measures the time for which the user presses and holds the symbol key K8 (Step #6).

Then, the display control portion 8 checks whether or not the long press of the symbol key K8 is performed based on an output of the touch panel portion 6 and time keeping by the time keeping portion 82 (Step #7). When the output of the touch panel portion 6 becomes a state where no key on the software keyboard screen 93 is pressed before the time keeping portion 82 measures the long press time T1, the display control portion 8 recognizes that the symbol key K8 is not long pressed. In addition, when other key displayed on the software keyboard screen 93 is pressed before the time keeping portion 82 measures the long press time T1, the display control portion 8 recognizes that the symbol key K8 is not long pressed. On the other hand, when the symbol key K8 is pressed and held for longer than the long press time T1, the display control portion 8 recognizes that the symbol key K8 is long pressed.

When the long press of the symbol key K8 is performed (Yes in Step #7), the display control portion 8 automatically accepts input of the character or the like corresponding to the long pressed symbol key K8 (automatic input), and controls the liquid crystal display portion 5 to display the character or the like corresponding to the symbol key K8 automatically input in the input result display field 930 (Step #8).

Next, the display control portion 8 checks whether or not the correction key K9 is pressed (Step #9). If the correction key K9 is not pressed (No in Step #9), the flow should go back to Step #2. On the other hand, if the correction key K9 is pressed (Yes in Step #9), the display control portion 8 recognizes the number of times of which the correction key K9 is pressed (Step #10).

Then, the display control portion 8 updates the number of correction times that is the accumulated number of times of which the correction key K9 has been pressed after the long press by the logged-in user stored in the memory 81 (or the storage device 72) (Step #11 in FIGS. 11 and 12). In other words, the memory 81 or the like of the operation panel 1 stores the number of correction times that is the accumulated number of times of which the correction key K9 has been pressed for each user after the automatic input of a symbol by long press.

Then, the display control portion 8 checks whether or not the number of correction times has reached (exceeded) a predetermined number of times (first number of times) (Step #12). If the number of correction times has not reached the predetermined number of times (No in Step #12), the flow should go back to Step #2. On the contrary, if the number of correction times has reached the predetermined number of times (Yes in Step #12), the display control portion 8 checks whether or not the long press time T1 is a longest time determined in advance as a limit for the logged-in user (Step #13).

Note that the longest time is determined for avoiding an endless increase of the long press time T1. For instance, the longest time is set to a few seconds (for example, approximately two to three seconds). Note that the longest time may be longer than three seconds or shorter than two seconds (for example, approximately 1.5 seconds), which can be arbitrarily determined.

If the long press time T1 is not the longest time (No in Step #13), the display control portion 8 updates and increases the long press time T1 for the logged-in user, which is stored in the memory 81 (or the storage device 72) (Step #14). Thus, the long press time T1 is increased. In this way, the input receiving portion (display control portion 8) controls the storage portion (memory 81 or the storage device 72) to store the number of correction times that is the number of times of which the correction key K9 is pressed after the automatic input, and increases the long press time T1 every time when the number of correction times reaches the predetermined first number of times. Thus, when the erroneous input due to the long press is corrected, the time until the long press is recognized is set to be longer. In other words, in accordance with the state of using, the long press time T1 can be set. Therefore, it is possible to prevent an unintentional long press of the symbol key K8 by an elder person or a person with a handicapped hand or finger. In addition, an unintentional automatic re-input of a symbol by an unintentional long press of the symbol key K8 can be eliminated. Thus, it is possible to eliminate a correction work of a symbol input erroneously so that a burden on the user can be reduced.

Note that the time of increasing the long press time T1 is determined in view of avoiding an erroneous input by long press. For instance, the long press time T1 is increased by a step of 100 milliseconds. Note that the time of increasing the long press time T1 may be set to approximately 200 to 300 milliseconds or to be shorter than 100 milliseconds (for example, approximately 50 milliseconds), which can be arbitrarily determined.

When the long press time T1 is the longest time (Yes in Step #13), and after Step #14, the display control portion 8 resets the number of correction times stored in the memory 81 (or the storage device 72) (Step #15). After that, the flow should go back to Step #2.

In addition, when the symbol key K8 is not long pressed (No in Step #7), the display control portion 8 controls the memory 81 (or the storage device 72) to update the normal input number of times that is the accumulated number of times of which keys are input without the long press by the logged-in user (Step #16). In other words, the memory 81 or the like of the operation panel 1 stores the accumulated number of times of which the symbol keys K8 are pressed smoothly without exceeding the long press time T1 (the normal input number of times) for each user.

Then, the display control portion 8 checks whether or not the normal input number of times has reached the predetermined number of times (second number of times) (Step #17). If the normal input number of times has not reached the predetermined number of times (No in Step #17), the flow should go back to Step #2. On the contrary, if the normal input number of times has reached the predetermined number of times (Yes in Step #17), the display control portion 8 checks whether or not the long press time T1 is a predetermined shortest time as a lower limit of the long press time T1 for the logged-in user (Step #18).

Note that the shortest time is determined for avoiding an endless decrease of the long press time T1. For instance, the shortest time is set to approximately 500 milliseconds. Note that the shortest time may be set longer than 500 milliseconds or shorter than the same (for example, approximately 300 milliseconds), which can be arbitrarily determined. In this way, at least one of the longest time and the shortest time of the long press time T1 is determined in advance. Thus, the long press time T1 is not set to be extremely long or short. Therefore, it is possible to avoid that the input becomes difficult due to that the long press time T1 is set to be extremely long or short.

If the long press time T1 is not the shortest time (No in Step #18), the display control portion 8 updates and decrease the long press time T1 of the logged-in user stored in the memory 81 (or the storage device 72) (Step #19). In this way, the input receiving portion (display control portion 8) controls the storage portion (the memory 81 or the storage device 72) to store the normal input number of times that is the number of times of which the symbol keys K8 are pressed without being the long press, and decreases the long press time T1 every time when the normal input number of times reaches the predetermined second number of times. Thus, the long press time T1 can be decreased for a person who can press keys without an unintentional long press. Therefore, it is possible to eliminate cases where the user feels that the time until the long press is recognized is long or gets frustrated. Thus, the long press time T1 can be decreased.

Note that the decreasing time of the long press time T1 is determined in view of reducing cases where the user feels that the time until the long press is recognized is long. For instance, the long press time T1 is decreased by a step of 100 milliseconds. Note that the decreasing time of the long press time T1 may be set to 100 milliseconds or longer (for example, 150 milliseconds) or may be set to 100 milliseconds or shorter (for example, approximately 30 to 80 milliseconds), which can be arbitrarily determined.

Further, if the long press time T1 is the shortest time (Yes in Step #18), and after Step #19, the display control portion 8 resets the normal input number of times of the logged-in user stored in the memory 81 (or the storage device 72) (Step #20). After that, the flow should go back to Step #2.

Next, other embodiments are described. In the above-mentioned embodiment, there is described an example where the display control portion 8 accepts input to the operation panel 1. However, instead of the display control portion 8, the main control portion 7 may perform the process to be performed by the display control portion 8. In this case, the main control portion 7 functions as a control portion of the operation panel 1.

In addition, in the above-mentioned embodiment, there is described the long press for input with the symbol key K8 in the software keyboard displayed on the liquid crystal display portion 5. However, it is possible to apply to a character input device including a keyboard in which the symbol key K8 is disposed as a hardware key.

In addition, in the above-mentioned embodiment, there is described the long press for input with the symbol key K8 displayed on the liquid crystal display portion 5. However, it is possible to apply to a long press of a key in the ten-key portion 11. In this case, a key included in the ten-key portion 11 is regarded as the symbol key K8.

Although the embodiments of the present disclosure are described above, the scope of the present disclosure is not limited to the embodiments and can be embodied with various modifications without being deviated from the spirit of the disclosure.

What is claimed is:

1. A symbol input device comprising:
   a plurality of symbol keys for inputting symbols including characters and numerals, each of the symbol keys being assigned one symbol;
   a correction key for correcting input symbols;
   a time keeping portion for measuring a time for which the symbol key is pressed and held;
   a storage portion for storing data; and
   an input receiving portion which
      recognizes that the symbol key or the correction key is pressed so as to accept input with the symbol key or the correction key,
      recognizes the time for which the symbol key is pressed and held based on the measurement by the time keeping portion,
      accepts, on condition that the time for which the same symbol key is pressed and held exceeds a predetermined long press time, periodic, automatic re-input of a symbol so long as the symbol key keeps being pressed beyond the predetermined long press time,
      refers to, when the correction key is pressed after the re-input performed automatically, the number of times that the correction key has been pressed,
      controls the storage portion to update the number of correction times that is the accumulated number of times that the correction key has been pressed after the re-input,
      increases the long press time every time when the number of correction times reaches a predetermined first number of times, and
      resets the number of correction times when the long press time is increased, wherein
   the input receiving portion controls the storage portion to update a normal input number of times, which is an accumulated number of times that mutually different characters, numerals, or symbols have been input each without exceeding the long press time,
   every time the normal input number of times reaches a second number of times, the input receiving portion decreases the long press time,
   when the input receiving portion decreases the long press time, the input receiving portion also resets the normal input number of times, and
   one or both of a longest time as a higher limit of the long press time and a shortest time as a lower limit of the long press time are determined in advance.

2. The symbol input device according to claim 1, wherein
   the storage portion stores the long press time for each user, and
   the input receiving portion specifies the user based on the input with the symbol key, obtains the long press time for the specified user from the storage portion, and accepts the input by the obtained long press time.

3. The symbol input device according to claim 1, wherein when the symbol key is long pressed, the input receiving portion automatically accepts re-input of the character corresponding to the symbol key that is long pressed, at a constant period.

4. The symbol input device according to claim 1, further comprising:
   a display portion for displaying the plurality of symbol keys and the correction key; and
   a touch panel portion for detecting a pressed position in the display portion, wherein
   the input receiving portion recognizes the pressed symbol key or correction key based on an output of the touch panel portion so as to accept the input, and recognizes the time for which the symbol key is pressed and held.

5. An image forming apparatus comprising the symbol input device according to claim 1.

6. A method for controlling a symbol input device, the method comprising the steps of:
   recognizing that a symbol key for inputting a symbol including a character and a numeral, or a correction key for correcting input symbols is pressed, the symbol key being one of a plurality of symbol keys each assigned a symbol;

and accepting input with the symbol key or the correction key;

recognizing a time for which the symbol key is pressed and held based on measurement by a time keeping portion for measuring the time for which the symbol key is pressed and held; accepting, on condition that the time for which the same symbol key is pressed and held exceeds a predetermined long press time periodic, automatic re-input of a symbol so long as the symbol key keeps being pressed beyond the predetermined long press time; referring to, when the correction key is pressed after the re-input performed automatically, the number of times that the correction key has been pressed; controlling a storage portion for storing data to update the number of correction times that is the accumulated number of times that the correction key has been pressed the re-input; and increasing the long press time every time when the number of correction times reaches a predetermined first number of times, resetting the number of correction times when the long press time is increased;

controlling the storage portion to update a normal input number of times, which is an accumulated number of times that mutually different characters, numerals, or symbols have been input each without exceeding the long press time;

decreasing the long press time every time the normal input number of times reaches a second number of times, and when the long press time is decreased, resetting the normal input number of times; and determining in advance, one or both of a longest time as a higher limit of the long press time and a shortest time as a lower limit of the long press time.

7. A method for controlling the symbol input device according to claim 6, the method comprising the steps of:

controlling, when the symbol key is not long pressed, the storage portion to update a normal input number of times that is the accumulated number of times that the symbol key is pressed without the long press;

decreasing the long press time every time when the normal input number of times reaches a predetermined second number of times; and resetting the normal input number of times when the long press time is decreased.

8. A method for controlling the symbol input device according to claim 6, the method comprising the steps of:

controlling the storage portion to store the long press time for each user;

specifying the user based on the input with the symbol key;

obtaining the long press time for the specified user from the storage portion; and accepting the input by the obtained long press time.

9. A method for controlling the symbol input device according to claim 6, wherein when the symbol key is long pressed, re-input of the character corresponding to the symbol key that is long pressed is automatically accepted at a constant period.

10. A method for controlling the symbol input device according to claim 6, the method comprising the steps of:

recognizing the pressed symbol key or correction key based on an output of a touch panel portion for detecting a pressed position in the display portion displaying the plurality of symbol keys and the correction key, so as to accept the input; and recognizing the time for which the symbol key is pressed and held.

11. A method for controlling the symbol input device according to claim 6, wherein at least one of a longest time and a shortest time of the long press time is determined in advance.

* * * * *